United States Patent
Weingarten et al.

(10) Patent No.: US 9,536,612 B1
(45) Date of Patent: Jan. 3, 2017

(54) DIGITAL SIGNALING PROCESSING FOR THREE DIMENSIONAL FLASH MEMORY ARRAYS

(71) Applicant: DENSBITS TECHNOLOGIES LTD., Haifa (IL)

(72) Inventors: Hanan Weingarten, Herzelia (IL); Erez Sabbag, Koranit (IL)

(73) Assignee: AVAGO TECHNOLOGIES GENERAL IP (SINGAPORE) PTE. LTD, Yishun (SG)

( * ) Notice: Subject to any disclaimer, the term of this patent is extended or adjusted under 35 U.S.C. 154(b) by 0 days.

(21) Appl. No.: 14/162,493

(22) Filed: Jan. 23, 2014

(51) Int. Cl.
    *G11C 16/10* (2006.01)
    *G11C 16/04* (2006.01)

(52) U.S. Cl.
    CPC .......... *G11C 16/10* (2013.01); *G11C 16/0408* (2013.01); *G11C 2211/562* (2013.01); *G11C 2211/5622* (2013.01); *G11C 2211/5641* (2013.01); *G11C 2211/5648* (2013.01); *G11C 2213/75* (2013.01)

(58) Field of Classification Search
    CPC .......... G11C 2213/75; G11C 2211/562; G11C 2211/5622; G11C 2211/5641; G11C 2211/5648
    See application file for complete search history.

(56) References Cited

U.S. PATENT DOCUMENTS

| | | |
|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Bryg |
| 5,729,490 A | 3/1998 | Calligaro et al. |
| 5,740,395 A | 4/1998 | Hasburn |

(Continued)

OTHER PUBLICATIONS

Search Report of PCT Patent Application WO 2009/118720 A3, Mar. 4, 2010.

(Continued)

*Primary Examiner* — Vanthu Nguyen
(74) *Attorney, Agent, or Firm* — Reches Patents

(57) ABSTRACT

A method for multilevel programming flash memory cells of a three dimensional array of flash memory cells, the method may include receiving or determining a multiple phase programming scheme that is responsive to coupling between flash memory cells of the three dimensional array; and programming data to multiple flash memory cells of the three dimensional array in response to the multiple phase programming scheme. The multiple phase programming scheme determine a manner in which multiple programming levels are applied. At least two programming levels of the multiple programming levels correspond to bits of different significance.

32 Claims, 15 Drawing Sheets

500

(56) References Cited

U.S. PATENT DOCUMENTS

| | | |
|---|---|---|
| 5,745,418 A | 4/1998 | Hu et al. |
| 5,778,430 A | 7/1998 | Federico |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett |
| 7,388,781 B2 | 6/2008 | Litsyn |
| 7,395,404 B2 | 7/2008 | Gorobets |
| 7,441,067 B2 | 10/2008 | Gorobets et al. |
| 7,443,729 B2 | 10/2008 | Li |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell |
| 7,619,922 B2 | 11/2009 | Li |
| 7,697,326 B2 | 4/2010 | Sommer et al. |
| 7,706,182 B2 | 4/2010 | Shalvi et al. |
| 7,716,538 B2 | 5/2010 | Gonzalez |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,889,571 B2 * | 2/2011 | Norman .................... 365/189.05 |
| 7,911,848 B2 | 3/2011 | Eun |
| 7,961,797 B1 | 6/2011 | Yang et al. |
| 7,975,192 B2 | 7/2011 | Sommer |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang |
| 8,250,324 B2 | 8/2012 | Haas |
| 8,300,823 B2 | 10/2012 | Bojinov |
| 8,305,812 B2 | 11/2012 | Levy |
| 8,327,246 B2 | 12/2012 | Weingarten |
| 8,407,560 B2 | 3/2013 | Ordentlich |
| 8,417,893 B2 | 4/2013 | Khmelnitsky |
| 8,472,280 B2 * | 6/2013 | Li .............................. 365/238.5 |
| 8,559,231 B2 * | 10/2013 | Goda et al. ............... 365/185.25 |
| 8,867,280 B2 * | 10/2014 | Park et al. ................ 365/185.24 |
| 2001/0034815 A1 | 10/2001 | Dugan et al. |
| 2002/0063774 A1 | 5/2002 | Hillis et al. |
| 2002/0085419 A1 | 7/2002 | Choi |
| 2002/0154769 A1 | 10/2002 | Petersen et al. |
| 2002/0156988 A1 | 10/2002 | Sekibe |
| 2002/0174156 A1 | 11/2002 | Birru |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Jeong |
| 2003/0192007 A1 | 10/2003 | Miller et al. |
| 2004/0015771 A1 | 1/2004 | Lasser et al. |
| 2004/0030971 A1 | 2/2004 | Shibata |
| 2004/0059768 A1 | 3/2004 | Denk |
| 2004/0080985 A1 | 4/2004 | Chang et al. |
| 2004/0153722 A1 | 8/2004 | Lee |
| 2004/0153817 A1 | 8/2004 | Chevallier |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0195651 A1 | 8/2006 | Estakhri |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes |
| 2006/0294312 A1 | 12/2006 | Walmsley |
| 2007/0025157 A1 | 2/2007 | Wan et al. |
| 2007/0063180 A1 | 3/2007 | Asano et al. |

(56) References Cited

U.S. PATENT DOCUMENTS

| | | |
|---|---|---|
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim |
| 2008/0116509 A1 | 5/2008 | Harari et al. |
| 2008/0126686 A1 | 5/2008 | Sokolov et al. |
| 2008/0127104 A1 | 5/2008 | Li |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov |
| 2008/0158958 A1 | 7/2008 | Sokolov et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0144598 A1 | 6/2009 | Yoon |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi |
| 2009/0287930 A1 | 11/2009 | Nagaraja |
| 2009/0300269 A1 | 12/2009 | Radke et al. |
| 2009/0323942 A1 | 12/2009 | Sharon |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang |
| 2011/0209028 A1 | 8/2011 | Post |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

(56) References Cited

U.S. PATENT DOCUMENTS

2012/0124273 A1    5/2012   Goss et al.
2012/0246391 A1    9/2012   Meir

OTHER PUBLICATIONS

Search Report of PCT Patent Application WO 2009/095902 A3, Mar. 4, 2010.
Search Report of PCT Patent Application WO 2009/078006 A3, Mar. 4, 2010.
Search Report of PCT Patent Application WO 2009/074979 A3, Mar. 4, 2010.
Search Report of PCT Patent Application WO 2009/074978 A3, Mar. 4, 2010.
Search Report of PCT Patent Application WO 2009/072105 A3, Mar. 4, 2010.
Search Report of PCT Patent Application WO 2009/072104 A3, Mar. 4, 2010.
Search Report of PCT Patent Application WO 2009/072103 A3, Mar. 4, 2010.
Search Report of PCT Patent Application WO 2009/072102 A3, Mar. 4, 2010.
Search Report of PCT Patent Application WO 2009/072101 A3, Mar. 4, 2010.
Search Report of PCT Patent Application WO 2009/072100 A3, Mar. 4, 2010.
Search Report of PCT Patent Application WO 2009/053963 A3, Mar. 4, 2010.
Search Report of PCT Patent Application WO 2009/053962 A3, Mar. 4, 2010.
Search Report of PCT Patent Application WO 2009/053961 A3, Mar. 4, 2010.
Search Report of PCT Patent Application WO 2009/037697 A3, Mar. 4, 2010.
Yani Chen, Kcshab K. Parhi, "Small Area Parallel Chien Search Architectures for Long BCH Codes", Ieee Transactions On Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction To Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions On Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com, 2005.
Paulo Cappelletti, Clara Golla, Piero Olivo, Enrico Zanoni, "Flash Memories", Kluwer Academic Publishers, 1999.
Jedec Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., " Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

\* cited by examiner

DIGITAL SIGNALING PROCESSING FOR THREE DIMENSIONAL FLASH MEMORY ARRAYS

BACKGROUND OF THE INVENTION

Nonvolatile flash memory devices store information in the form of charge in a flash memory cell. A flash memory cell may consist of a CMOS transistor with an additional floating metal gate between the substrate and the transistors gate or it may be constructed with no floating metal gate such that charge may be trapped in the insulator between the control gate and the channel. The charge is either stored in the floating gate or in the insulator and is injected to the floating gate during an operation known as programming. The charge may be removed during an operation known as an erase operation.

As the charge in the floating gate or insulator may vary contiguously, it is possible to store more than just one bit per flash transistor by using several charge levels to symbolize different sequences of bits.

FIG. 1 demonstrates a voltage level distribution for a 3 pbc (bits per cell) flash memory cell. The voltage level distribution includes eight lobes 101-108. Each lobe represents a 3-bit value.

The voltage level distributions of FIG. 1 illustrates non-overlapping lobes, however this is only schematic, and in practical cases the lobes may overlap. The reason for overlapping may be intentional for obtaining high programming speed, or due to the retention effect. For floating gate devices, an "old" page, may introduce greater overlap between lobes than a new page, since after many program/erase (P/E) cycles there is accumulated trap charge, which is de-trapped over time. After a long duration, every lobe may have a larger standard deviation (STD) and may have a different mean location. These effects are also known as retention.

The 3 bpc cell includes a most significant bit (MSB), a central significant bit (CSB) and a least significant bit (LSB). A physical page of flash memory module may store three logical pages. This physical page is programmed one logical page after the other. The programming includes various types of programming such as MSB programming (in which some of the cells are programmed to a single lobe and some are left in the erase state. At the end of this programming process only two lobes exists, the erase and the MSB lobes), a CSB programming (in which the erase lobe and the MSB lobe are each split into two lobes by further programming pulses, depending on the original state of each cell and the corresponding CSB bit. At the end of this step there are four lobes) and a LSB programming (in which each of the four lobes is further split to create 8 lobes, overall). The logical pages are read by applying various types of read operations such as MSB read (in which a MSB threshold 114 is used), CSB read (in which two CSB thresholds 112 and 116 are used) and LSB read (in which four LSB thresholds 111, 113, 115 and 117 are used). FIG. 2 shows similar distributions for the case of 2 bpc devices.

The previous paragraph describes one method. There are several methods for programming 8 lobes.

A NAND flash array (or block) is constructed from NAND flash memory cells. The NAND flash memory cells are grouped into columns (or strings). FIG. 3 shows a typical prior art portion 30 of a NAND flash memory array that includes thirty two lines (wordlines 31(1)-32(32)) and multiple (Q) columns (32(1)-32(Q)).

Once Colum 32($q$) is illustrated in further details—it shows the thirty two flash memory cells 34($q$) of the column, bit line select transistor and ground select transistor, and the voltages 33($q$) supplied to the transistors and flash memory cells (Bit Line Select, Vbias, Vth). Column 32($q$) is connected to sense amplifier 35($q$), that in turn is connected to latch 36($q$). A string (column) is duplicated many times (for example Q=34560-250000 times) in a block and includes several (for example—thirty two) flash memory cells. Each of the flash memory cells is associated with a different wordline (or row) which connects all of the corresponding cells in the other strings of the block. When a block is chosen, each string is connected to a corresponding bitline by turning on the Bit Line Select and the Ground Select transistors. When a read operation is performed, a sense amplifier is connected to the bit-line and after allowing some time (say 25-125 uS) for the bit-line voltage to settle, the result is stored by a latch.

In order to measure the charge in a certain cell within a string, all other cells are switched on by applying a high voltage on their gates (given by Vbias) and a comparison voltage, Vth, is applied to the gate of the selected cell. If the cell is charged and Vth is not high enough, the gate will not allow current to flow and the sense-amplifier will output a "0". On the other hand, if the cell is not charge or Vth is high enough, current will flow and the sense-amplifier will output a "1". Different schemes may exist where the cell being samples is biased with a constant voltage (say Vcc) but in the sense-amplifier a comparison against a reference string is performed which reference value may be determined by some external voltage, Vth.

The above sampling technique holds when a bit may be obtained only through a single threshold comparison. When more than a single threshold comparison is required, the above procedure may be performed for each threshold and the results may then be combined. Alternatively, several sense-amplifiers may be used simultaneously, each one compares against a different threshold, and the results are then combined to yield the required bit value.

All cells in a word-line (physical page) are programmed simultaneously and read simultaneously. In case of MLC or TLC, the programming of a wordline is divided into two or three stages, referred to as MSB, CSB and LSB page programming stages.

Above we described a standard floating gate planar NAND device. Historically, planar NAND design enabled continued storage capacity density improvements through continuous shrinking of the basic cell feature sizes from one NAND technology node to the next, reducing the basic gate size from 48 nm-41 nm-32 nm-25 nm-19 nm. However, it is proving harder and harder to shrink the basic silicon process feature size for several reasons. The main reasons include: a. limitations in the tools required and b. limitation in the reliability of a single NAND flash cell. The NAND Flash cell reliability is primarily determined by the number of electrons use to store a state in a cell. In smaller technology nodes (such as 16 nm) the number of electrons per state in a cell becomes very small (a few tens), greatly reducing the reliability of the stored information.

Therefore, it has been suggested to produce a multi-layered NAND Flash memory array which overcome the limits of planar NAND design and which continues with current trends in storage density improvements. It was suggested that in a multi-layered NAND Flash array, the basic feature size will be much larger than current planar NAND feature size (e.g. 40 nm instead of 19 nm) and thus eliminating the problems associated with such small technology nodes (namely, tooling and NAND transistor reliability). However, to allow improvement in density, the NAND arrays are to be stacked one on top of the other, 64-128 floor high. Thus, obtain a gain in the vertical dimension, which is higher than the loss due to going back from a 19 nm to 40 nm technology node. The introduction of NAND cell in a third dimension earned this technological advancement the name of 3D NAND.

There are various manners to build 3D NAND device and still allow the reduction in cost per bits, even though the production process has become more complicated and requires more steps. One of the key steps which allows the reduction of the cost is etching or hole drilling which enables to simultaneously produce multiple NAND gates on several floors, without increasing the cost linearly with the number of floors.

Several methods have been suggested for producing 3D NAND which differ in how the NAND cells are organized in space. Non-limiting examples of 3D NAND arrays include the bit cost scalable (BiCS) standard memory, pipe shaped BiCS memory (p-BiCS) of Toshiba, the terabit cell array transistor (TACT) of Toshiba, the Vertical recess array transistor (VRAT) of Samsung, a 3D dual control-gate with a surrounding floating-gate of Hynix.

In a vertical channel design, the NAND Flash bit-line or column described previously and in FIG. 3, end up as a vertical column, perpendicular to the base axis of the die. This is also shown schematically in FIG. 5 where multiple vertical planes 101(1)-101(J), each having an array of flash memory cells 101(1)-102(J) connected via bit lines 103. In general the j'th plane (j ranging between 1 and J) 101(j) has multiple pages (such as page 4) each page (or row) includes multiple flash memory cells and the cells of each page are read concurrently.

All pages belonging to the same bit-lines (to the same plane) constitute a block—thus planes 101(1)-101(J) form J erase blocks. As in the planar case, all cells belonging to the same block are erased simultaneously and all cells belonging to the same page/row are programmed simultaneously. A block may constitute more than one plane, as shown in FIG. 6 in which erase block 105(1) includes two planes 101(1) and 101(2).

FIG. 7 shows a slightly more complex structure of vertical channel 3D NAND. This is Toshiba's p-BiCS structure where each bit-line is actually made of two vertical lines connected at the bottom (U-shape) and flash memory cells are arranged in pairs such as pairs 106(1)-106(4)—wherein one flash memory cell of the pair is connected to one vertical line and the other flash memory cell of the pair is connected to the other vertical line (both vertical lines are connected at their bottom).

In a vertical channel 3D NAND the NAND Flash bit-line or column is horizontal to the base axis of the die, as shown in FIG. 4. The bit-line and rows are defines in a similar manner as in the vertical channel. The planes 101(1)-101(J) are horizontal.

A 3D NAND array adds additional disturb factors. One of these is additional cell to cell coupling. Now each cell has many more neighboring cells. Instead of nine neighboring cells in a planar NAND (four near neighbors and four diagonal), now there are twenty six neighbors to each cell 200 (see FIG. 9) where we can distinguish between three levels of neighbors. Six level one neighbors 201, twelve level two neighbors 202 and eight level three neighbors 203. Thus, the charge stored on neighboring cells may affect the threshold voltage of the center cell.

Cell to cell coupling in 3D NAND is also different than in planar NAND through coupling between different blocks. Different blocks may affect one another through the cells on their borders. Since in standard NAND, block programming order is arbitrary, it is difficult to control the coupling effects on the boarders of the blocks.

It should be noted that cell to cell coupling may vary, depending on 3D NAND implementation and may also exhibit no coupling due to the basic structure of the NAND cell. However, it is inevitable that as 3D NAND device technology node will shrink to increase density, so will cell to cell coupling will become more severe.

The coupling effect between cells is further increased when multiple bits per cell are programmed due to the larger charge and larger voltages.

In the following we present methods to limit the amount of disturb from neighboring cells using methods of programming ordering, depending on the 3D NAND structure, read back coupling cancellation methods and block management schemes.

SUMMARY

According to an embodiment of the invention there may be provided a method for multilevel programming flash memory cells of a three dimensional array of flash memory cells.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
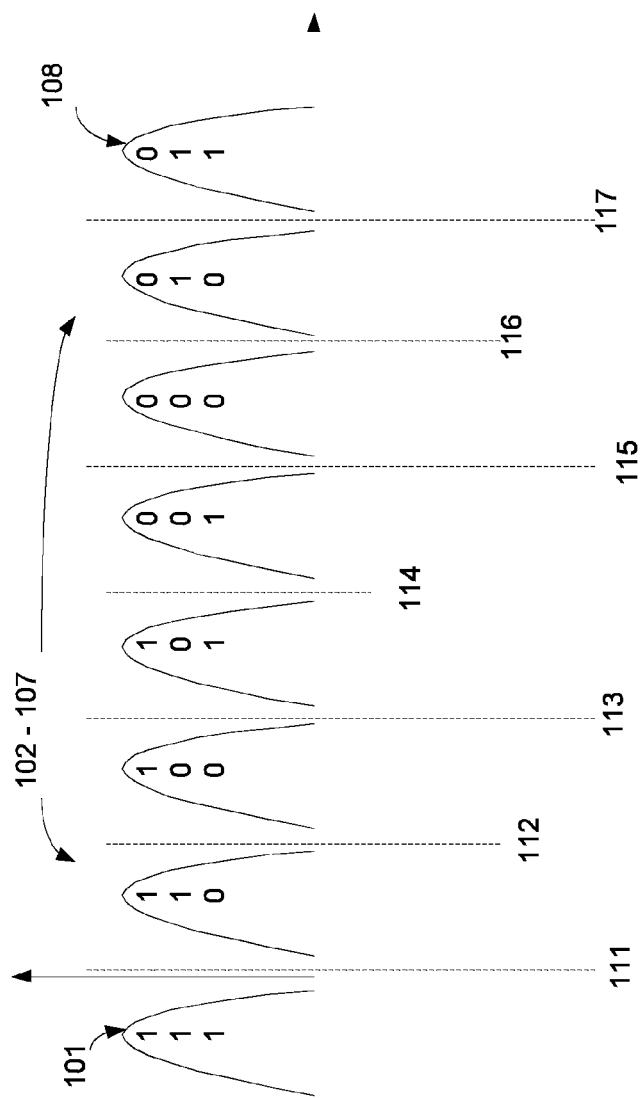
FIG. 1 illustrates a prior art threshold voltage distribution.
Figure 2:
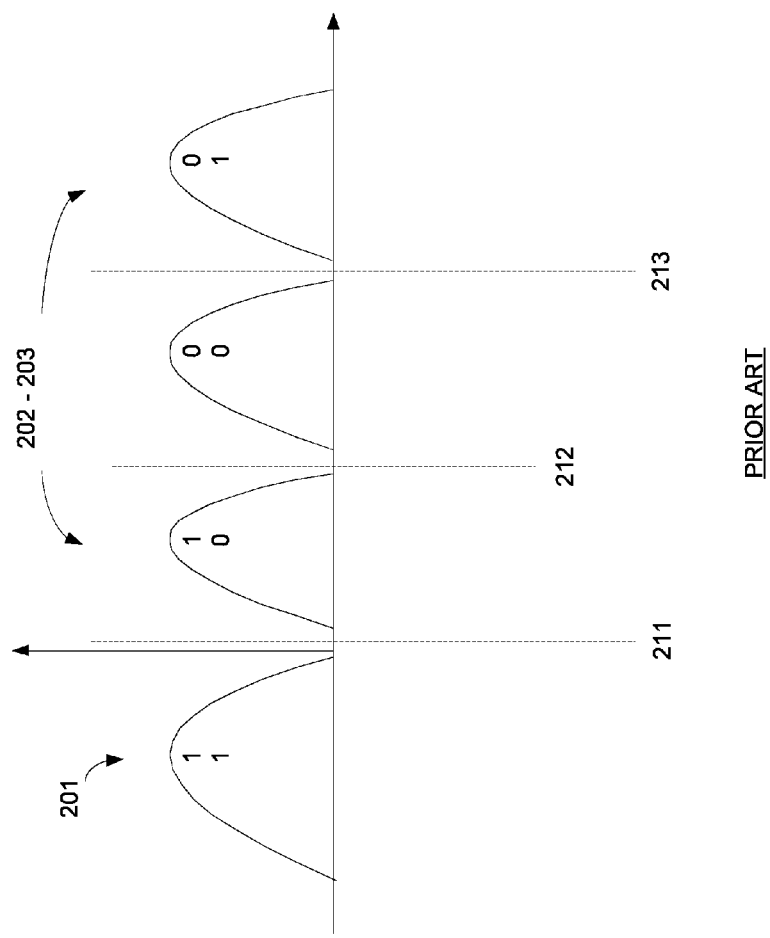
FIG. 2 illustrates a prior art threshold voltage distribution.
Figure 3:
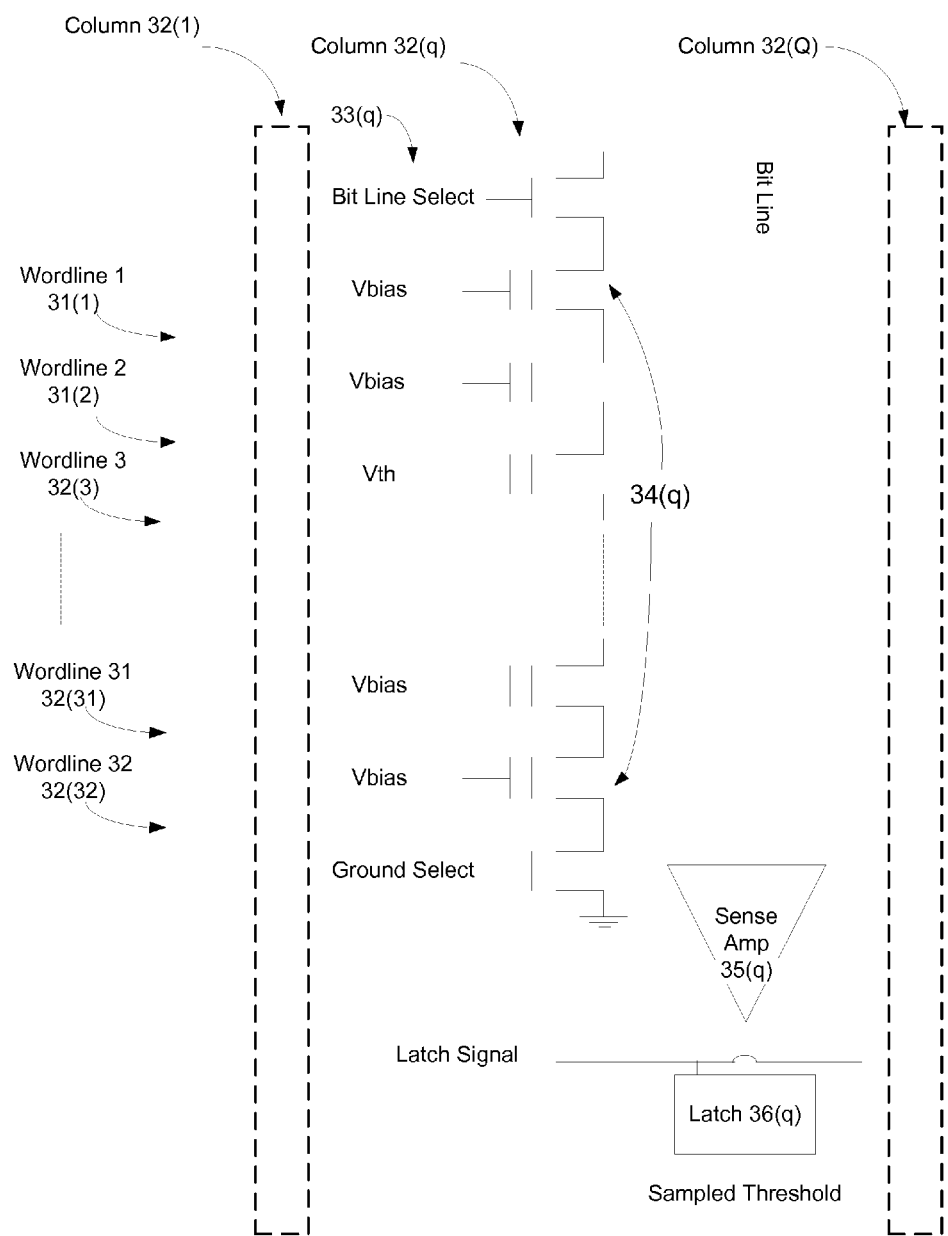
FIG. 3 illustrates a prior art portion of a two dimensional NAND array.
Figure 4:
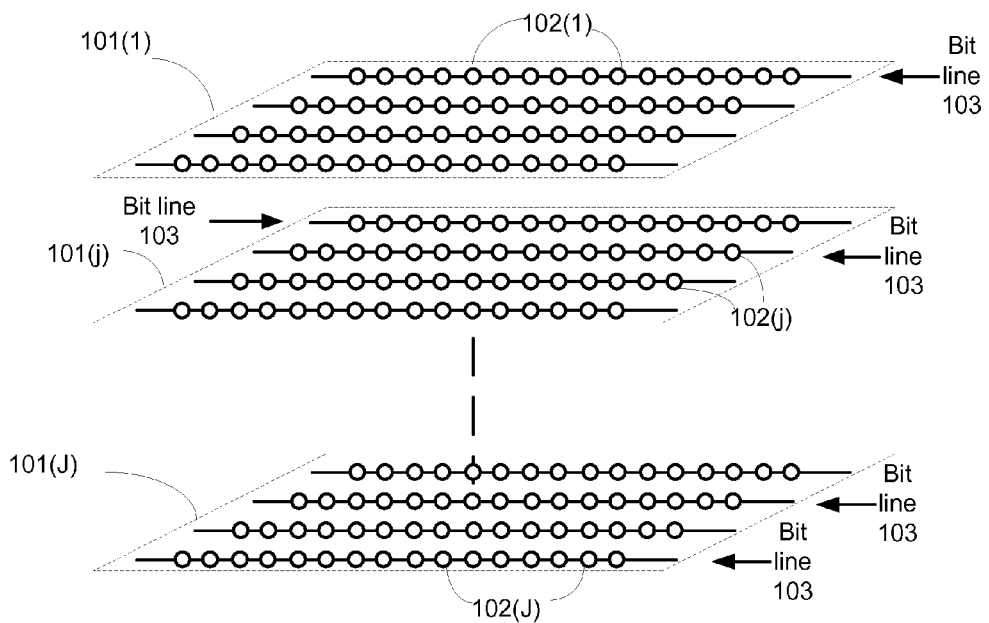
FIGS. 4-7 illustrates prior art portions of three dimensional NAND flash memory arrays.
Figure 5:
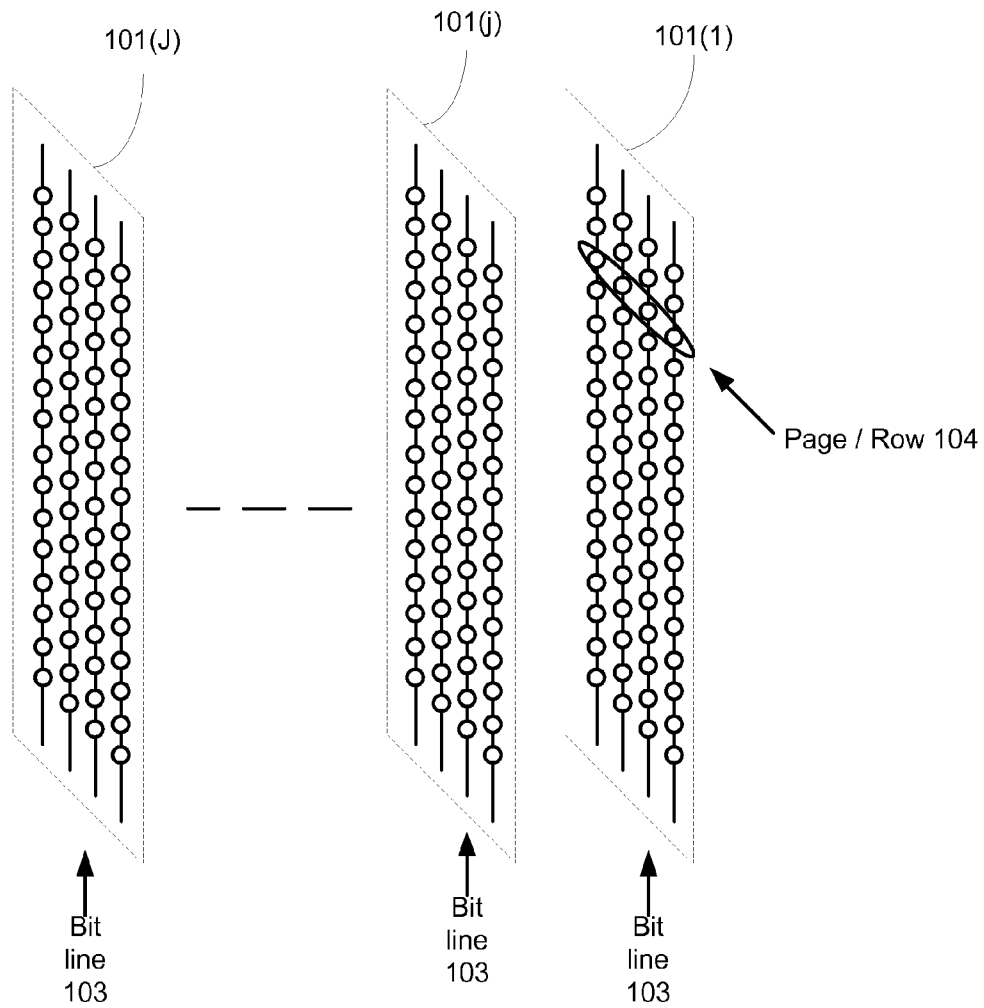
Figure 6:
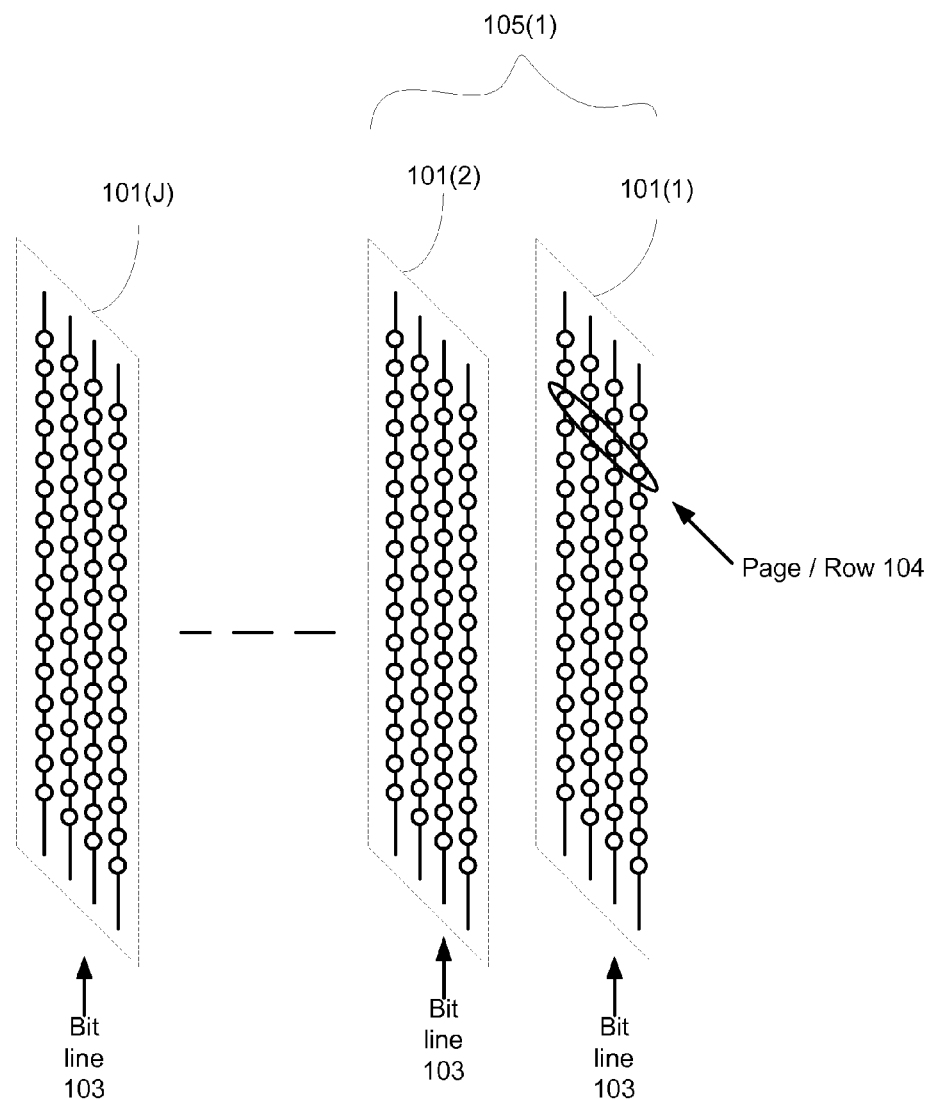

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

The invention describes methods, systems and computer readable media for managing three dimensional arrays of flash memory cells.

The terms "cell", "memory cell" and "flash memory ell" are used in an interchangeable manner.

The following description refers to a multiple phase programming scheme. Any reference to the multiple phase programming scheme should be applied mutatis mutandis to programming according to the multiple phase programming scheme. The multiple phase programming scheme is termed "multiple phase" as it related to different programming phases. The different phases may correspond to different programming levels—to programming bits of different significance (such as MAB programming, zero or more CSB programming and LSB programming). The multiple phase programming scheme may determine the order of programming different cells, pages, rows, planes, erase blocks of super-blocks that include multiple erase blocks. Additionally or alternatively the multiple phase programming scheme may define parameters such as density of programming (types of allowable levels of programming and the like), differences between programming edge flash memory cells and non-edge flash memory cells and the like.

A three dimensional array of flash memory cells may be an ordered array or a non-ordered array. The array may be a rectangular array but other shapes of arrays can also be provided. An array is three dimensional in the sense that multiple flash memory cells are surrounded by other flash memory cells from more than two directions.

Decoupling Through Programming

There is provided a multi-bit per cell scheme that is used during the cell programming. In such a scheme, the programming is performed in phases which may or may not correspond to bits in a cell. For simplicity of explanation it is assumed that different phase correspond to different programming levels.

In order to reduce coupling not all stages are programmed into the row one following the other. Rather, the stages may be programmed first to one row and the next one and only after performing the programming all first stage on neighboring rows, will we return to the first row and program the second stage.

We can define the following general rules to reduce coupling:
  a. Do not proceed to program the second stage on a row before all neighboring rows were programmed with the first stage.
  b. Do not proceed to program the third stage on a row before all neighboring rows were programmed with the second stage.

The definition of neighboring rows is through the definition of neighboring cells as far as they coupling effect is concerned. That is, we define a neighboring cell if it has some coupling effect on current cell.

The above schemes allow for several programming orders. Let us consider the case where a NAND block consists of a cube of cells. The cube of cell can be divided into a plane of rows where the first element of all rows lies on the same plane—the same plane that defines the plane of rows. Therefore, we can define the programming order as a two dimensional map which defines the programming order of each page within this two dimensional map.

Figure 8:
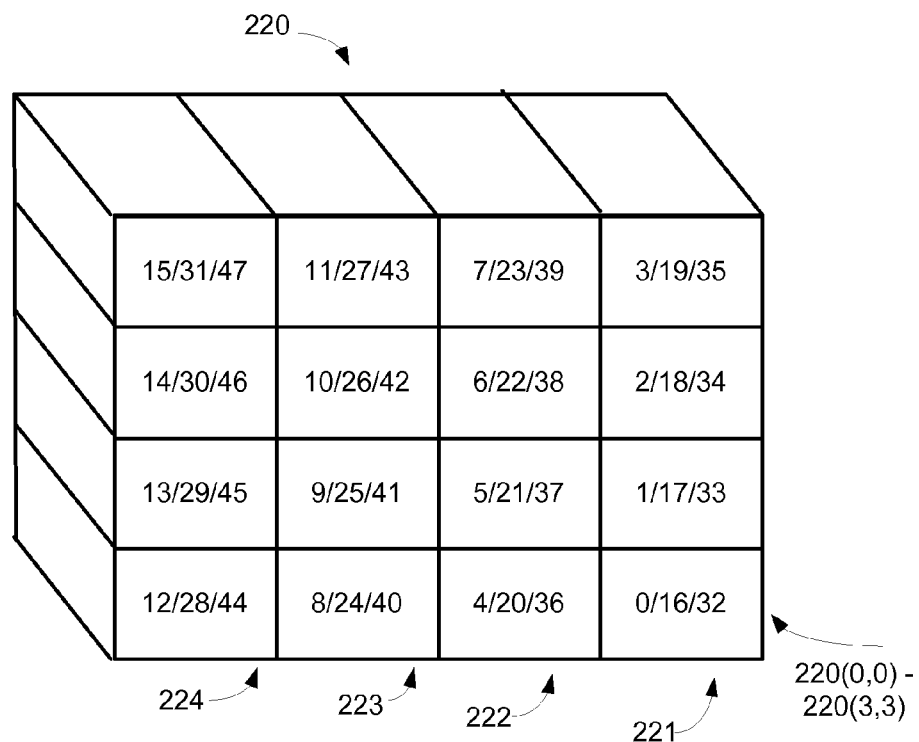
FIG. 8 illustrates multiple pages of a three dimensional array of flash memory cells and an order of programming these pages according to an embodiment of the invention.

One example is to program the first stage on all rows within the block, then the second stage of all rows within a block and last, the third stage of all rows in the block. As shown in FIG. 8. In FIG. 8 there are sixteen pages arranged in a 4×4 matrix of pages. Each page is represented by a box and each box includes three numbers X/Y/Z, wherein the each number represents a programming order, wherein the leftmost number (X) represents an order for performing a most significant bit programming of the page, the middle number (Y) represents an order for performing a central significant bit programming of the page and the rightmost number (Z) represents an order for performing a least significant bit programming of the page.

Accordingly the order of programming may include:

| Order | level | Page     | Order | level | Page     | Order | level | Page     |
|-------|-------|----------|-------|-------|----------|-------|-------|----------|
| 0     | MSB   | 210(0,0) | 16    | CSB   | 210(0,0) | 32    | LSB   | 210(0,0) |
| 1     | MSB   | 210(0,1) | 17    | CSB   | 210(0,1) | 33    | LSB   | 210(0,1) |
| 2     | MSB   | 210(0,2) | 18    | CSB   | 210(0,2) | 34    | LSB   | 210(0,2) |
| 3     | MSB   | 210(0,3) | 19    | CSB   | 210(0,3) | 35    | LSB   | 210(0,3) |
| 4     | MSB   | 210(1,0) | 20    | CSB   | 210(1,0) | 36    | LSB   | 210(1,0) |
| 5     | MSB   | 210(1,2) | 21    | CSB   | 210(1,2) | 37    | LSB   | 210(1,2) |
| 6     | MSB   | 210(1,3) | 22    | CSB   | 210(1,3) | 38    | LSB   | 210(1,3) |
| 7     | MSB   | 210(1,4) | 23    | CSB   | 210(1,4) | 39    | LSB   | 210(1,4) |
| 8     | MSB   | 210(2,0) | 24    | CSB   | 210(2,0) | 40    | LSB   | 210(2,0) |

| Order | level | Page | Order | level | Page | Order | level | Page |
|---|---|---|---|---|---|---|---|---|
| 9 | MSB | 210(2,1) | 25 | CSB | 210(2,1) | 41 | LSB | 210(2,1) |
| 10 | MSB | 210(2,2) | 26 | CSB | 210(2,2) | 42 | LSB | 210(2,2) |
| 11 | MSB | 210(2,3) | 27 | CSB | 210(2,3) | 43 | LSB | 210(2,3) |
| 12 | MSB | 210(3,0) | 28 | CSB | 210(3,0) | 44 | LSB | 210(3,0) |
| 13 | MSB | 210(3,1) | 29 | CSB | 210(3,1) | 45 | LSB | 210(3,1) |
| 14 | MSB | 210(3,2) | 30 | CSB | 210(3,2) | 46 | LSB | 210(3,2) |
| 15 | MSB | 210(3,3) | 31 | CSB | 210(3,3) | 47 | LSB | 210(3,3) |

A second method is to divide the two dimensional map into diagonals. For example, starting from the lower right corner, will be a diagonal of one element (see FIG. 9).

Then we need only to order the programming order of the diagonal programming (where within a diagonal we program the rows in order, starting from the upper right corner and going down to the lower left corner). In the example in FIG. 9 there is provided a method where after programming the first stage into a given row of the diagonals we first program the first stage to the following two diagonals before continuing to the second stage into the given row. The third programming stage is programmed in a similar order with respect to the second programming stage.

Figure 9:
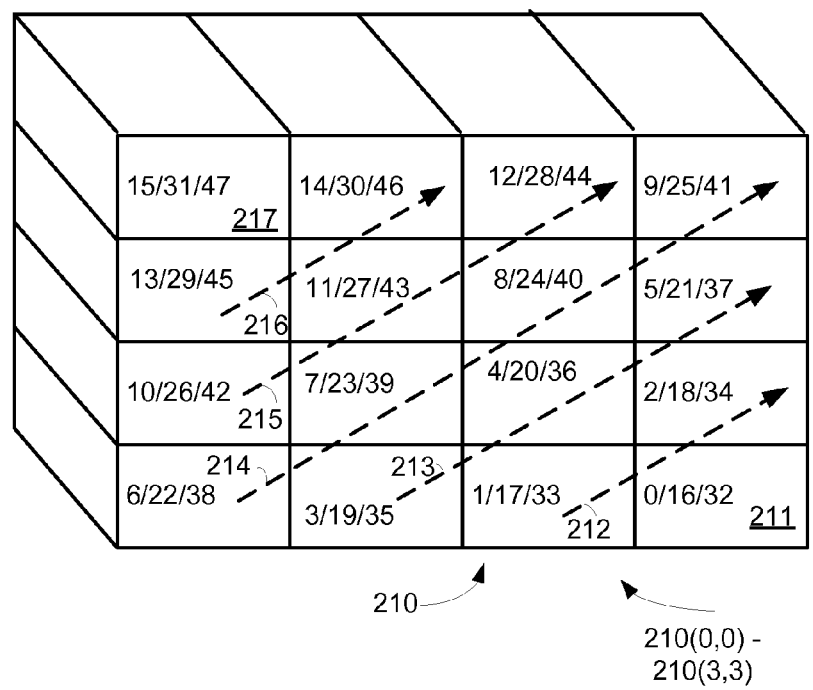
FIG. 9 illustrates a prior art cell and his proximate neighboring cells.

The above scheme can be generalized as follows: do not program stage j into diagonal t before stage j−1 has been programmed to diagonals t+1 . . . t+v where v is designated as the programming order type. See, for example, FIG. 9. In FIG. 9 there are sixteen pages arranged in a 4×4 matrix of pages. Each page is represented by a box and each box includes three numbers X/Y/Z, wherein the each number represents a programming order, wherein the leftmost number (X) represents an order for performing a most significant bit programming of the page, the middle number (Y) represents an order for performing a central significant bit programming of the page and the rightmost number (Z) represents an order for performing a least significant bit programming of the page.

Accordingly the order of programming may include:

| Order | level | Page | Order | level | Page | Order | level | Page |
|---|---|---|---|---|---|---|---|---|
| 0 | MSB | 210(0,0) | 16 | CSB | 210(0,0) | 32 | LSB | 210(0,0) |
| 1 | MSB | 210(1,0) | 17 | CSB | 210(1,0) | 33 | LSB | 210(1,0) |
| 2 | MSB | 210(0,1) | 18 | CSB | 210(0,1) | 34 | LSB | 210(0,1) |
| 3 | MSB | 210(2,0) | 19 | CSB | 210(2,0) | 35 | LSB | 210(2,0) |
| 4 | MSB | 210(1,1) | 20 | CSB | 210(1,1) | 36 | LSB | 210(1,1) |
| 5 | MSB | 210(0,2) | 21 | CSB | 210(0,2) | 37 | LSB | 210(0,2) |
| 6 | MSB | 210(3,0) | 22 | CSB | 210(3,0) | 38 | LSB | 210(3,0) |
| 7 | MSB | 210(2,1) | 23 | CSB | 210(2,1) | 39 | LSB | 210(2,1) |
| 8 | MSB | 210(1,2) | 24 | CSB | 210(1,2) | 40 | LSB | 210(1,2) |
| 9 | MSB | 210(0,3) | 25 | CSB | 210(0,3) | 41 | LSB | 210(0,3) |
| 10 | MSB | 210(3,1) | 26 | CSB | 210(3,1) | 42 | LSB | 210(3,1) |
| 11 | MSB | 210(2,2) | 27 | CSB | 210(2,2) | 43 | LSB | 210(2,2) |
| 12 | MSB | 210(1,3) | 28 | CSB | 210(1,3) | 44 | LSB | 210(1,3) |
| 13 | MSB | 210(3,2) | 29 | CSB | 210(3,2) | 45 | LSB | 210(3,2) |
| 14 | MSB | 210(2,3) | 30 | CSB | 210(2,3) | 46 | LSB | 210(2,3) |
| 15 | MSB | 210(3,3) | 31 | CSB | 210(3,3) | 47 | LSB | 210(3,3) |

It is noted that although the previous examples (FIGS. 8 and 9) illustrate the same order of programming per level that the programming order of one level may differ from a programming level of another level. For example—diagonal programming of MSB, column based programming of CSB and diagonal programming for LSB. Additionally or alternatively different diagonal programming (or different column based programming) may be applied during different programming levels.

Figure 7:
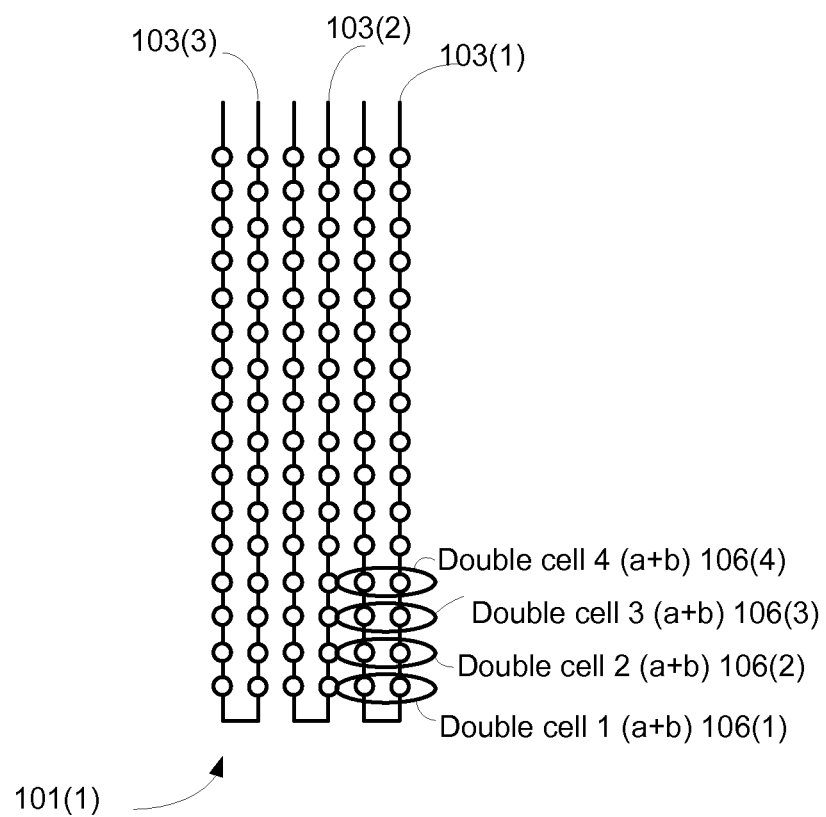

The mentioned above programming orders may be applied mutatis mutandis to the p-BiCS U-shape bit-line structure shown in FIG. 7. This is done by coupling every two horizontally neighboring cells on the p-BiCS bit line. Then programming each couple as a unit starting from the left one (the 'a' cell) and then the right one (the 'b' cell). As shown in FIG. 7. The programming order of each cell coupling is the defined above, in the same manner as was done for the simple vertical bit-line.

All of the above methods also hold, with simple adaptation, for the vertical gate 3D NAND devices and for 2 bit per cells as well. It should be noted that the general rule above allows for many more programming order combinations.

Decoupling Through Reading

Above we described programming orders which are intended to reduce the coupling effect through limitations on charge increase between each programming step. However, this method does not completely eliminate coupling, only reduces it.

Furthermore, we have not considered what happens between block boundaries, where no effort was yet done to reduce coupling. Therefore, in the following we suggest a method that takes into account coupling during a read operation in 3D NAND devices.

In general we can model the measured cell pass threshold as a linear combination which is a result of the target cell charge and all neighboring cells charge.

This can be roughly described in the following formula:

$$V_T(\text{Target Cell}) = PV_T(\text{Target Cell}) + \sum_{i=1}^{n_{neighbors}} a_i \cdot C_i \quad \text{Equation (1)}$$

Where $C_i$, $i=1 \ldots n_{neighbors}$ is denote at the neighboring cells $a_i$, $i=1 \ldots n_{neighbors}$ are coefficients that predict the effect of a charge at the neighboring cells on $V_T$. $PV_T$ (Target Cell) is the intended program voltage of the target cell and $V_T$ (Target Cell) is the actual measure target voltage of the cell.

We can replace $C_i$ with a linear estimator of $C_i$ based on rough measurements of $V_T$ at the neighboring cells such that $$V_T(\text{Target Cell}) = \quad \text{Equation (2)}$$
$$PV_T(\text{Target Cell}) + \sum_{i=1}^{n_{neighbors}} b_i \cdot V_T(\text{neighbor } i) + \text{noise}$$

Where $b_i$, $i=1 \text{ n} \ldots n_{neighbors}$ are coefficients that predict the effect of a rough measurement of the neighboring $V_T$ on the target cell $V_T$ (Target Cell). The noise is some random variable the replaces the uncertainty in the estimation of the effect of the neighboring $V_T$ on the target cell $V_T$.

We assume throughout that the neighboring cells are ordered based on the absolute value of $b_i$, starting for largest to smallest (starting from neighbor which most affects target cell).

When a row read operation is performed, it is typically made through a rough estimation of the row cells $V_T$, based on a single threshold comparison per distinguished lobe couple. The programmed values of the neighboring cells may affect the read value by shifting it across the compared read threshold. To overcome the error source we suggest performing the one or all of the following operations:

1) Roughly read neighboring rows (to roughly estimate the intended programmed lobe) and estimate the added term in Equation (2) due to neighboring cells. Decode using Log Likelihood Ratios (LLRs) which are based on the size of the added term. Large added terms should result in small LLRs (less certainty for given read page) and small added terms should result in large LLRs (more certainty for given read page).
2) Read with higher precision target row (say 3 bit precision) and roughly read neighboring rows. Estimate the added term in Equation (2) and add it to the read row values. Perform soft decoding of the target cells where the LLRs are estimated based on the noise term of Equation (2) variance.
3) Same as in 2) above but read neighboring cells with higher precision to reduce the added noise term of Equation (2).
4) Order the decoding effort of steps 1), 2) and 3) above in the following manner:
   a. Begin with step 1) above, but read only some of the neighboring rows (only the rows which most affect the added term of Equation (2)).
   b. If step 'a' failed, read more (or all) neighboring rows.
   c. If step 'b' failed, read target row with high precision and perform step 2) above. (No need to read neighboring rows, since they were already read in b).
   d. If step 'c' failed, perform step 3 by performing additional page reads of the neighboring cell and attempting to decode.
   Note that some of the steps a-d above can be skipped.

Note that in order to reduce memory consumption, it is not necessarily needed to read all neighboring rows into internal controller memory and save them for future calculation (as there may be quite a few neighboring rows), but rather, we can read each row and add its affect to an existing accumulator which will hold in the end the added term of Equation (2).

Figure 12:
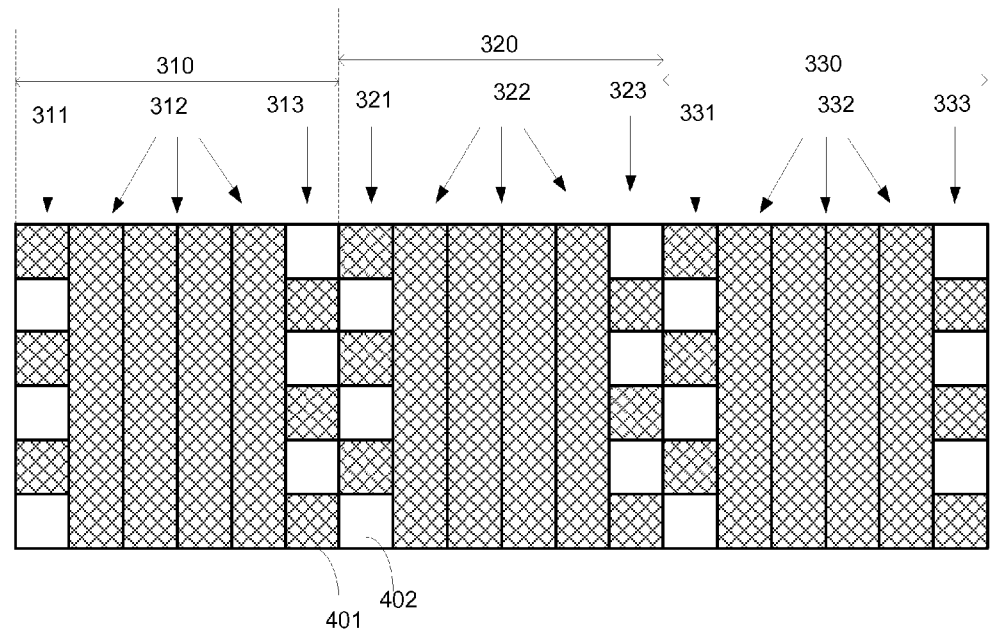
FIG. 12 illustrates an application of edge and non-edge programming rules on three adjacent super-blocks according to an embodiment of the invention.
Figure 13:
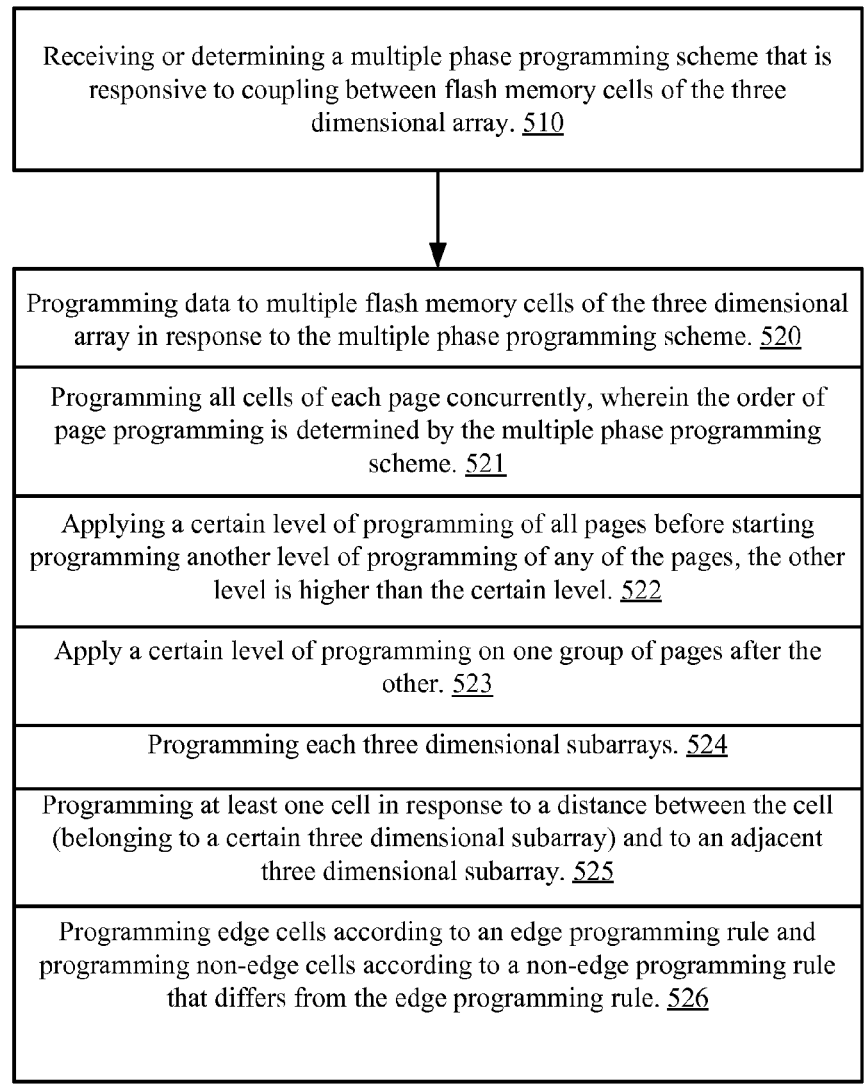
FIG. 13 illustrates a method according to an embodiment of the invention.

An example of a method that may apply the above decoupling by reading is illustrated in FIG. 12.

FIG. 12 illustrates method 600 according to an embodiment of the invention.

Method 600 may start by stage 610 of reading first flash memory cells to provide a first read result.

Stage 610 may be followed by stage 620 of reading second flash memory cells to provide a second read result.

Stages 610 and 620 may be followed by stage 630 of estimating logical values stored in the first flash memory cells in response to the first result, the second read result and a coupling between the first and second flash memory cells. The first flash memory cells and the second flash memory cells belong to the three dimensional array.

The first and second flash memory cells may belong to adjacent subsets of the three dimensional array.

Figure 10:
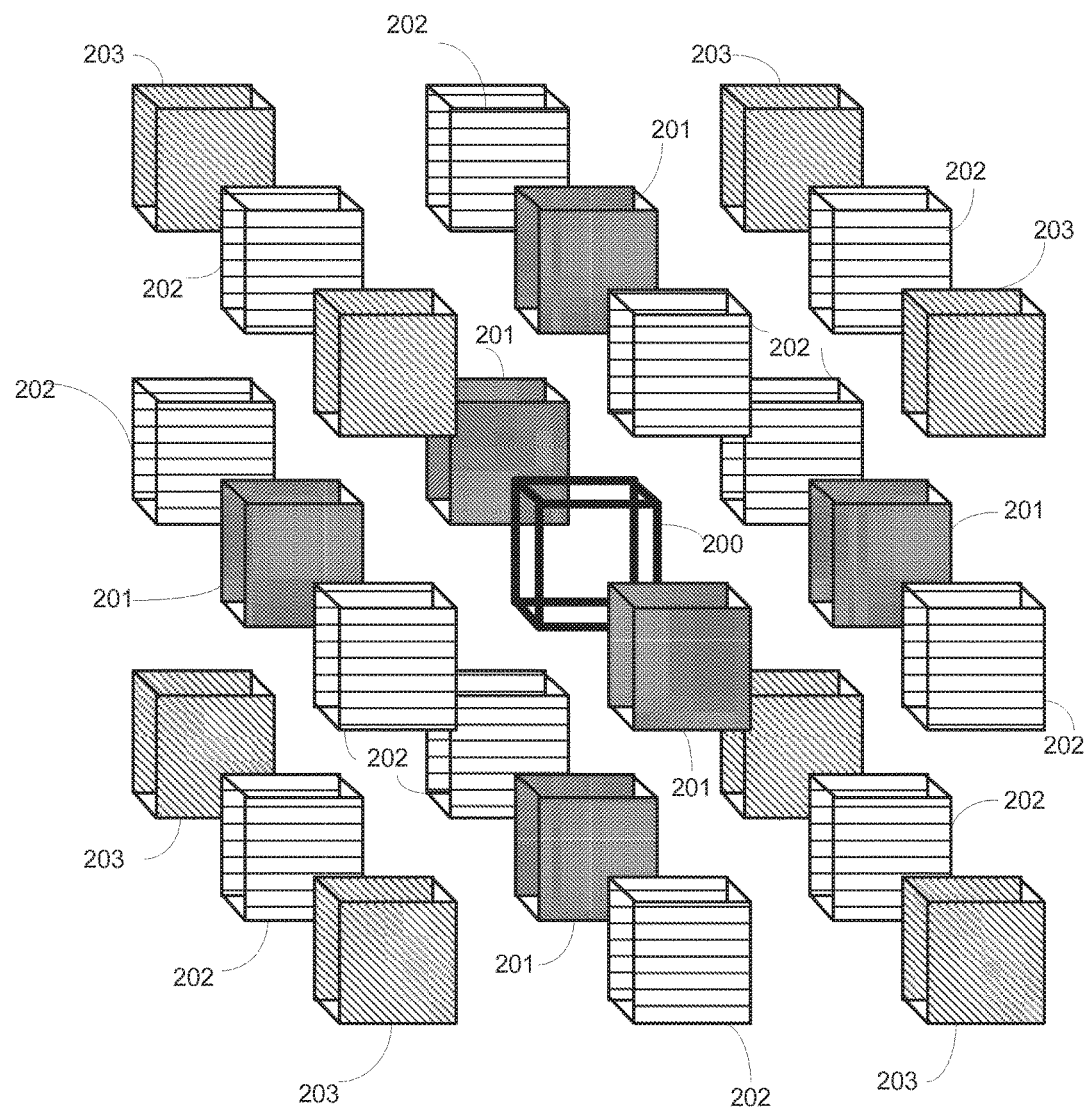
FIG. 10 illustrates multiple pages of a three dimensional array of flash memory cells and an order of programming these pages according to an embodiment of the invention.

The second flash memory cells may partially surround the first flash memory cells from at least three orthogonal directions. Referring to FIG. 10—assuming that the first flash memory cell is cell 200 then the second flash memory cells may include any combination of any one of cells 201, 202 and 203.

The second flash memory cells may form at least a majority of flash memory cells that affect the first read result.

The reading (620) of the second flash memory cells may be coarser than the reading (610) of the first flash memory cells.

The estimating (630) may include soft decoding the first and second read results.

The estimating (630) may include associating a reliability value to the estimation of the logical values stored in the first flash memory cells.

Stage 630 may be followed by stage 640 of determining whether to read one or more additional sets of flash memory cells in response to a result of the soft decoding.

Stage 630 (and even stage 620) may be followed by stage 640 of reading third flash memory cells to provide third read result; and stage 650 of estimating the logical values stored in the first flash memory cells in response to the first result, the second read result, the third read result, a coupling between the first and second flash memory cells, and a coupling between the first and third flash memory cells.

Although the mentioned above method was illustrated in relation to two or three read operations the method can be applicable to more than three read operations.

In general, method 600 may include repeating the stages of: determining whether to read next flash memory cells; reading, according to the determining, the next flash memory cells to provide a next read result; and estimating the logical values stored in the first flash memory cells in response to the first till next results and to coupling between the first flash memory cells and the second till next flash memory cells.

Memory Management to Reduce Block to Block Coupling Effect

Figure 11:
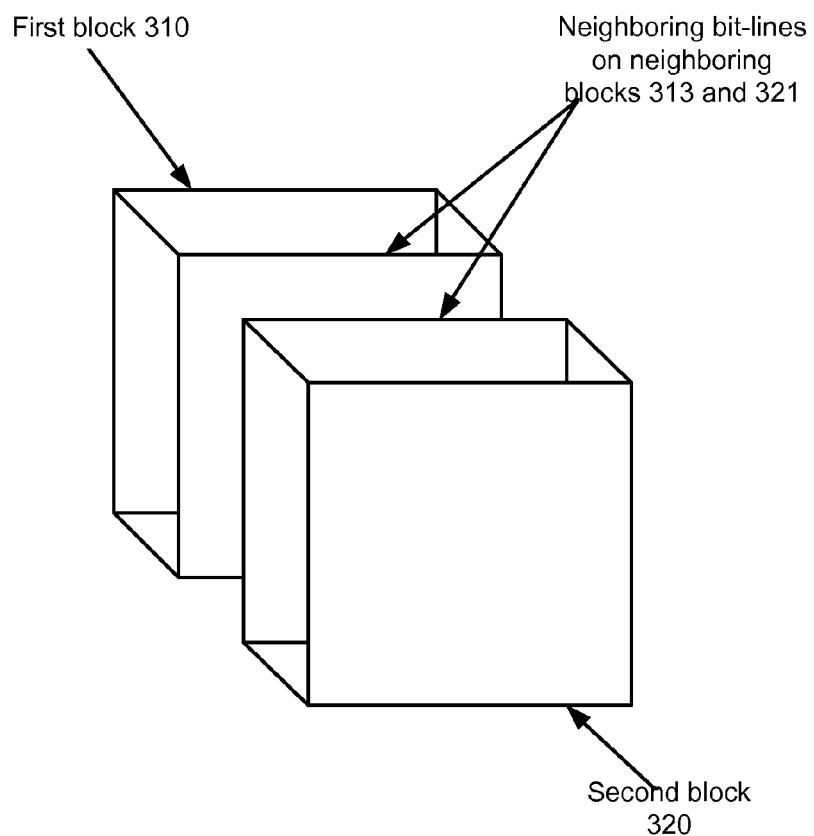
FIG. 11 illustrates two super-blocks according to an embodiment of the invention.

The programming ordering methods described above are only effective within blocks. However, due to the 3D NAND structure, the NAND rows may suffer from coupling disturb from physically nearby blocks. As blocks may be full cubes of cells, bit-lines on the borders of a block may suffer from coupling from neighboring blocks that were programmed later (see FIG. 11—first and second erase blocks 310 and 320 are proximate to each other and edge cells in planes 313 and 321 may strongly affect each other). This effect may be much more pronounced if the blocks are actually not cubes but actually a single plain of bit-lines (very thin cubes). FIG. 11 is just an example and the coupling may also be affected on other sided of the block cube.

To overcome this problem or to reduce its effect we suggest following some or all of the following methods:
   a. Define larger blocks, such as super-blocks that are made of several neighboring erase blocks and programmed these larger blocks as suggested above. This reduces the number of neighboring bit-lines in neighboring blocks. These super-blocks for three dimensional sub-arrays of flash memory cells.
   b. For large super-blocks, don't program bit-lines and cells in a page which are on the edge of the block.
   c. For large super-blocks, program the bit-lines at the edge of the block in a manner such that for one side of the block, every even page is programmed and odd page remains untouched (within the corresponding bit-lines). On the other side of the block, every odd page is programmed and even pages remain untouched. Thus, neighboring blocks don't have $1^{st}$ level neighboring cells. See FIG. 12.
   d. For large super-blocks, program the bit-lines at the edge of the block in a manner such that for one side of the block, every even page is programmed with 3 bits per cell and odd pages are programmed with 1 bit per cell (within the corresponding bit-lines). On the other side of the block, the reverse scheme is applied. Thus, neighboring blocks have $1^{st}$ level neighboring cells where one of the neighboring cells has only 1 bit per cell and therefore reduced coupling disturbs.

FIG. 12 illustrates three adjacent super-blocks 310, 320 and 330, each include multiple planes and may include multiple erase blocks. Super-block 310 include edge plane 311, non-edge planes 312 and edge plane 313. Super-block 320 include edge plane 321, non-edge planes 322 and edge plane 323. Super-block 330 include edge plane 331, non-edge planes 332 and edge plane 333.

FIG. 12 illustrates a staggered programming of the edge cells—pages or rows of edge planes are programming so that odd subsets of edge planes 313, 323 and 333 as well as even subsets of edge planes 313 are programmed in one manner while even subsets of edge planes 313, 323 and 333 as well as odd subsets of edge planes 313 are programmed in another manner that is less dense than the first manner. Alternatively, even subsets of edge planes 313, 323 and 333 as well as odd subsets of edge planes 313 are not programmed at all.

Figure 14:
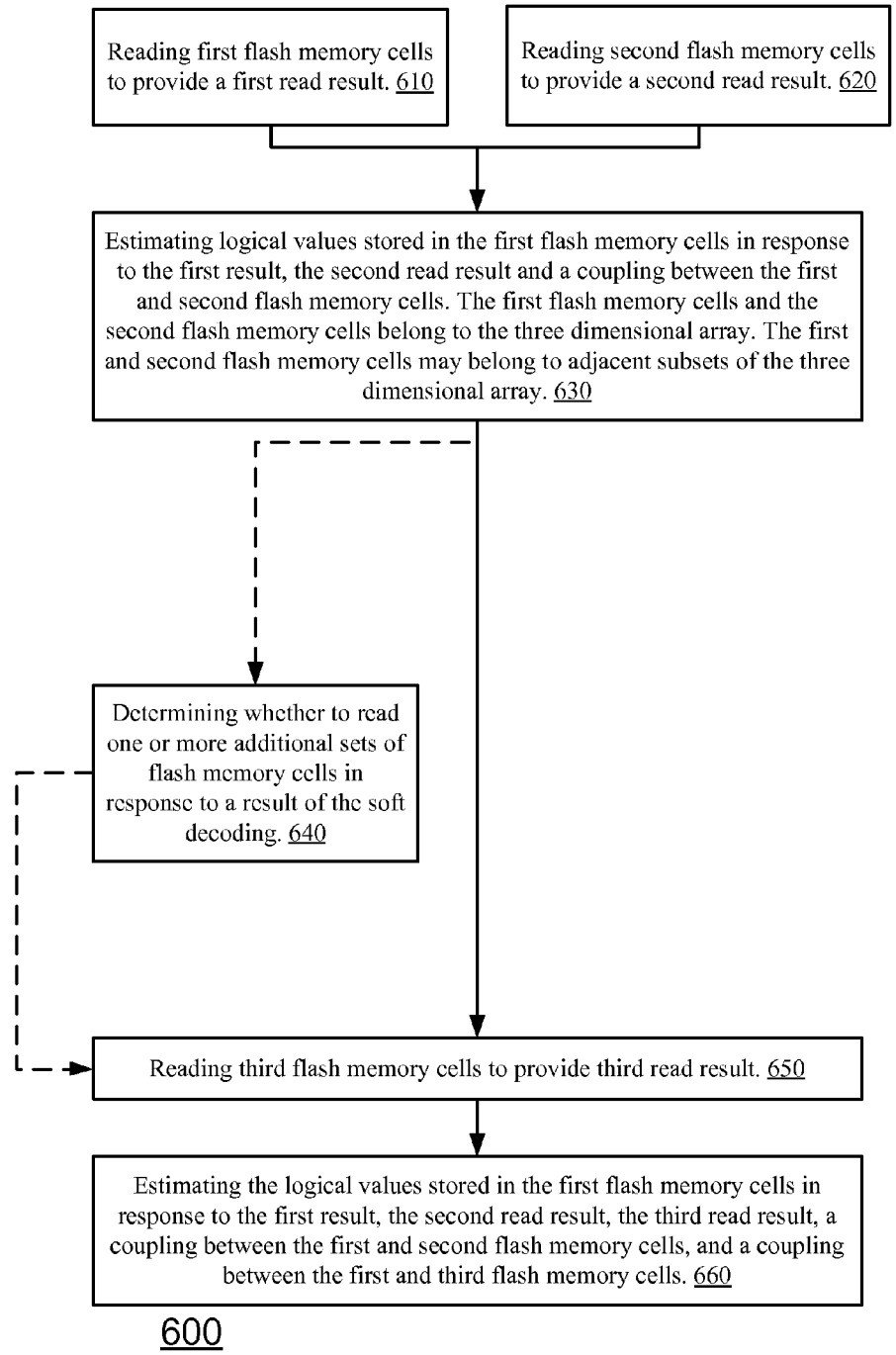
FIG. 14 illustrates a method according to an embodiment of the invention.

FIG. 14 illustrates method 500 for multilevel programming flash memory cells of a three dimensional array of flash memory cells, according to an embodiment of the invention.

Method 500 may start by stage 510 of receiving or determining a multiple phase programming scheme that is responsive to coupling between flash memory cells of the three dimensional array.

The multiple phase programming scheme determine a manner in which multiple programming levels are applied.

At least two programming levels of the multiple programming levels correspond to bits of different significance. For example—a three level programming scheme may include programming three bits per cell—including most significant bit, central significant bit and least significant bit.

Stage 510 may be followed by stage 520 of programming data to multiple flash memory cells of the three dimensional array in response to the multiple phase programming scheme.

The three dimensional array may include multiple planes of flash memory cells, each plane comprise multiple rows and columns of flash memory cells.

The multiple phase programming scheme may be responsive to coupling between flash memory cells that belong to different planes.

The flash memory cells of a same page may be programmed concurrently and wherein the multiple phase programming scheme determines an order of programming pages.

The multiple phase programming scheme of stage 510 may determine to apply a certain level of programming of all pages before starting programming another level of programming of any of the pages, the other level is higher than the certain level. The programming of stage 530 may include applying a certain level of programming of all pages before starting programming another level of programming of any of the pages.

The multiple pages may be arranged in an ordered array and the multiple phase programming scheme may determine to apply the certain level of programming on one group of pages after the other.

The pages of a same group may be located along a same virtual line. Each virtual line may be either parallel to or orthogonal to a plane. Alternatively—each virtual line is neither parallel or orthogonal to a plane.

Two non-limiting examples of programming orders of sixteen pages (an array of 4 by 4 pages) assuming three bit per cell programming are illustrated in FIG. 8 (column by column programming order) and in FIG. 9 (diagonal by diagonal order—as illustrated by dashed arrows 211-217).

The multiple phase programming scheme may include virtually partitioning the three dimensional array to multiple three dimensional subarrays. Non-limiting examples of such three dimensional arrays are provide din the super-blocks 310, 320 and 330 of FIGS. 11 and 12.

Each three dimensional subarray may include multiple planes, each plane may include multiple rows and columns of flash memory cells. See for example planes 311, 312 and 313 of three dimensional subarray 310, planes 321, 322 and 323 of three dimensional subarray 320 and planes 331, 332 and 333 of three dimensional subarray 330 of FIG. 12.

Each three dimensional subarray may include multiple erase blocks.

The multiple phase programming scheme may define at least one programming rule that is responsive to a distance between a flash memory cell that belong to a certain three dimensional subarray and to an adjacent three dimensional subarray.

The multiple phase programming scheme may define (a) an edge programming rule that is associated with edge flash memory cells (such as cells of planes 311, 313, 321, 323, 331 and 333 of FIG. 12) and (b) a non-edge programming rule that differs from the edge programming rule and is associated with non-edge flash memory cells (such as cells of planes 312, 322 and 332 of FIG. 12).

The non-edge programming rule may define a denser programming in relation to programming applied by the edge programming rule. For example—more bits can be programmed in non-edge planes than in edge planes.

FIG. 12 illustrates pages 402 that include non-programmed or less dense programmed (for example less bits per cell programmed) cells and well as more densely programmed pages 401. The non-edge planes 312, 322 and 332 may be ore densely programmed.

The edge programming rule may define programming only a part of the edge flash memory cells while leaving some edge flash memory un-programmed.

A first set of first edge memory cells of a first three dimensional subarray and (b) a first set of second edge memory cells of a second three dimensional subarray are positioned on both sides of a border between the first and second three dimensional subarrays See, for example the cells of planes 313 and 321 of subarrays 310 and 320.

The edge programming rule defines a programming of the first sets of first and second flash memory cells.

The edge programming rule may prevents programming of a first subset of first edge memory cells while facilitating programming of a corresponding first subset of second edge memory cell. In the following text the term corresponding may refer to cells located at the same location but at another three dimensional subarray.

The edge programming rule may facilitates programming of a second subset of first edge memory cells while preventing programming of a corresponding second subset of second edge memory cell.

The edge programming rule may define (a) a first edge maximal level for programming a first subset of first edge memory cells, and (b) a second edge maximal level for programming a first subset of second edge memory cells, and wherein the first edge maximal level differs from the second edge maximal level.

The edge programming rule may define a programming of the first sets of the flash memory cells in a manner that is opposite to a programming of the second set of flash memory cells.

Stage 520 may include at least one of the following:
a. Programming (521) all cells of each page concurrently, wherein the order of page programming is determined by the multiple phase programming scheme.
b. Applying (522) a certain level of programming of all pages before starting programming another level of programming of any of the pages, the other level is higher than the certain level.
c. Apply (523) a certain level of programming on one group of pages after the other. The pages of a same group may be located along a same virtual line. Each virtual line may be either parallel to or orthogonal to a plane. Alternatively—each virtual line is neither parallel or orthogonal to a plane.
d. Programming (524) each three dimensional subarrays.
e. Programming (525) at least one cell in response to a distance between the cell (belonging to a certain three dimensional subarray) and to an adjacent three dimensional subarray.
f. Programming (526) edge cells according to an edge programming rule and programming non-edge cells according to a non-edge programming rule that differs from the edge programming rule.

Figure 15:
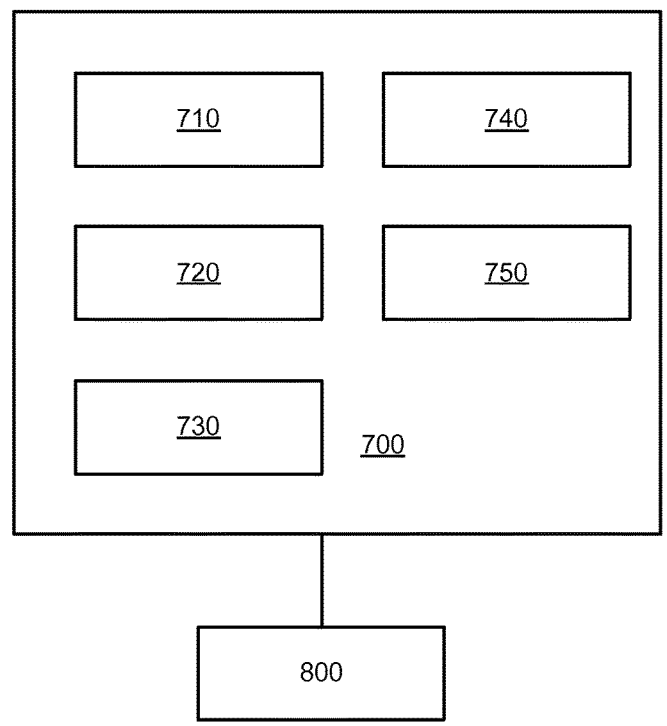
FIG. 15 illustrates a system according to an embodiment of the invention.

FIG. 15 illustrates a memory controller 700 according to an embodiment of the invention. Memory controller 700 is arranged to execute any stage, any combination of stage or entire methods out of methods 500 and 600.

Memory controller 700 is coupled to a three dimensional array of flash memory cells 800.

Memory controller 700 includes read circuit 710, write circuit 720, erase circuit 730, memory module 750 and estimating circuit 760.

The read circuit 710 is arranged to read first flash memory cells to provide a first read result and read second flash memory cells to provide a second read result. The estimating circuit 720 is arranged to estimate logical values stored in the first flash memory cells in response to the first result, the second read result and a coupling between the first and second flash memory cells; wherein first flash memory cells and the second flash memory cells belong to a three dimensional array.

Additionally or alternatively, memory module 750 is arranged to store a multiple phase programming scheme that is responsive to coupling between flash memory cells of the three dimensional array. The write circuit is arranged to program data to multiple flash memory cells of the three dimensional array in response to the multiple phase programming scheme. The multiple phase programming scheme determine a manner in which multiple programming levels are applied; wherein at least two programming levels of the multiple programming levels correspond to bits of different significance.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for multilevel programming flash memory cells of a three dimensional array of flash memory cells, the method comprising:
    receiving or determining a multiple phase programming scheme that is responsive to coupling between flash memory cells of the three dimensional array; and
    programming data to multiple flash memory cells of the three dimensional array in response to the multiple phase programming scheme; wherein the multiple phase programming scheme determine a manner in which multiple programming levels are applied;
    wherein at least two programming levels of the multiple programming levels correspond to bits of different significance;
    wherein the three dimensional array comprises multiple planes of flash memory cells, each plane comprise multiple rows and columns of flash memory cells; and
    wherein the multiple phase programming scheme determines an order of programming pages, wherein the order of programming pages is responsive to coupling between flash memory cells that belong to different planes.

2. The method according to claim 1 wherein flash memory cells of a same page are programmed concurrently.

3. The method according to claim 2 wherein the multiple phase programming scheme determines to apply a certain level of programming of all pages before starting programming another level of programming of any of the pages, the other level is higher than the certain level.

4. The method according to claim 3 wherein the pages are arranged in an ordered array and wherein the multiple phase programming scheme determines to apply the certain level of programming on one group of pages after the other.

5. The method according to claim 4 wherein each group of pages comprises pages located along a same virtual line.

6. The method according to claim 5 wherein each virtual line orthogonal to a plane.

7. The method according to claim 5 wherein each virtual line is neither parallel or orthogonal to a plane.

8. The method according to claim 1 wherein the multiple phase programming scheme comprises virtually partitioning the three dimensional array to multiple three dimensional subarrays.

9. The method according to claim 8 wherein each three dimensional subarray comprises multiple erase blocks.

10. The method according to claim 8 wherein the multiple phase programming scheme defines at least one programming rule that is responsive to a distance between a flash memory cell that belong to a certain three dimensional subarray and to an adjacent three dimensional subarray.

11. A method for multilevel programming flash memory cells of a three dimensional array of flash memory cells, the method comprising: receiving or determining a multiple phase programming scheme that is responsive to coupling between flash memory cells of the three dimensional array; and programming data to multiple flash memory cells of the three dimensional array in response to the multiple phase programming scheme; wherein the multiple phase programming scheme determine a manner in which multiple programming levels are applied; wherein at least two programming levels of the multiple programming levels correspond to bits of different significance;
wherein the multiple phase programming scheme defines (a) an edge programming rule that is associated with edge flash memory cells and (b) a non-edge programming rule that differs from the edge programming rule and is associated with non-edge flash memory cells.

12. The method according to claim 11, wherein the non-edge programming rule defines a denser programming in relation to programming applied by the edge programming rule.

13. The method according to claim 11, wherein the edge programming rule defines programming only a part of the edge flash memory cells while leaving some edge flash memory un-programmed.

14. The method according to claim 11, wherein (a) a first set of first edge memory cells of a first three dimensional subarray and (b) first set of second edge memory cells of a second three dimensional subarray are positioned on both sides of a border between the first and second three dimensional subarrays; and wherein the edge programming rule defines a programming of the first sets of first and second flash memory cells.

15. The method according to claim 14 wherein the edge programming rule prevents programming of a first subset of first edge memory cells while facilitating programming of a corresponding first subset of second edge memory cell.

16. The method according to claim 15 wherein the edge programming rule facilitates programming of a second subset of first edge memory cells while preventing programming of a corresponding second subset of second edge memory cell.

17. The method according to claim 14 wherein the edge programming rule defines (a) a first edge maximal level for programming a first subset of first edge memory cells, and (b) a second edge maximal level for programming a first subset of second edge memory cells, and wherein the first edge maximal level differs from the second edge maximal level.

18. The method according to claim 11, wherein the edge programming rule defines a programming of the first sets of the flash memory cells in a manner that is opposite to a programming of the second set of flash memory cells.

19. A non-transitory computer readable medium that stores instructions that once executed by the computer cause the computer to execute the stages of:
receiving or determining a multiple phase programming scheme that is responsive to coupling between flash memory cells of a three dimensional array; and
programming data to multiple flash memory cells of the three dimensional array in response to the multiple phase programming scheme;
wherein the multiple phase programming scheme determine a manner in which multiple programming levels are applied;
wherein at least two programming levels of the multiple programming levels correspond to bits of different significance; and
wherein at least one of the following is true:
(i) the three dimensional array comprises multiple planes of flash memory cells, each plane comprise multiple rows and columns of flash memory cells; and the multiple phase programming scheme determines an order of programming pages, wherein the order of programming pages is responsive to coupling between flash memory cells that belong to different planes;
(ii) the multiple phase programming scheme defines (a) an edge programming rule that is associated with edge flash memory cells and (b) a non-edge programming rule that differs from the edge programming rule and is associated with non-edge flash memory cells;
(iii) the three dimensional array comprises multiple planes of flash memory cells that comprise multiple pages, wherein the multiple pages are programmed one group of pages after the other; wherein each group of pages comprises pages located along a same virtual line; wherein each virtual line is orthogonal to a plane;
(iv) the three dimensional array comprises multiple planes of flash memory cells that comprise multiple pages, wherein the multiple pages are programmed one group of pages after the other; wherein each group of pages comprises pages located along a same virtual line; wherein each virtual line is neither parallel or orthogonal to a plane; and
(v) the multiple phase programming scheme determines, (a) for a first programming level, a diagonal programming order of pages of each plane of the three dimensional array, and (b) for a second programming level, a column based programming.

20. A memory controller, comprising a memory module for storing a multiple phase programming scheme that is responsive to coupling between flash memory cells of the three dimensional array; and a write circuit for programming data to multiple flash memory cells of the three dimensional array in response to the multiple phase programming scheme; wherein the multiple phase programming scheme determine a manner in which multiple programming levels are applied; wherein at least two programming levels of the multiple programming levels correspond to bits of different significance;
wherein at least one of the following is true:
(i) the three dimensional array comprises multiple planes of flash memory cells, each plane comprise multiple rows and columns of flash memory cells; and the multiple phase programming scheme determines an order of programming pages, wherein the order of programming pages is responsive to coupling between flash memory cells that belong to different planes;

(ii) the multiple phase programming scheme defines (a) an edge programming rule that is associated with edge flash memory cells and (b) a non-edge programming rule that differs from the edge programming rule and is associated with non-edge flash memory cells;

(iii) the three dimensional array comprises multiple planes of flash memory cells that comprise multiple pages, wherein the multiple pages are programmed one group of pages after the other; wherein each group of pages comprises pages located along a same virtual line; wherein each virtual line is orthogonal to a plane;

(iv) the three dimensional array comprises multiple planes of flash memory cells that comprise multiple pages, wherein the multiple pages are programmed one group of pages after the other; wherein each group of pages comprises pages located along a same virtual line; wherein each virtual line is neither parallel or orthogonal to a plane; and (v) the multiple phase programming scheme determines, (a) for a first programming level, a diagonal programming order of pages of each plane of the three dimensional array, and (b) for a second programming level, a column based programming.

21. A method for multilevel programming flash memory cells of a three dimensional array of flash memory cells, the method comprising: receiving or determining a multiple phase programming scheme that is responsive to coupling between flash memory cells of the three dimensional array; and programming data to multiple flash memory cells of the three dimensional array in response to the multiple phase programming scheme; wherein the multiple phase programming scheme determine a manner in which multiple programming levels are applied; wherein at least two programming levels of the multiple programming levels correspond to bits of different significance; wherein the three dimensional array comprises multiple planes of flash memory cells, each plane comprise multiple rows and columns of flash memory cells; and wherein one of the following is true:
  (i) the multiple phase programming scheme determines a diagonal programming order of pages of each plane of the three dimensional array; and
  (ii) the multiple phase programming scheme determines, (a) for a first programming level, a diagonal programming order of pages of each plane of the three dimensional array, and (b) for a second programming level, a column based programming.

22. The method according to claim 1, wherein one of the following is true:
  (i) the multiple phase programming scheme determines, (a) for a first programming level, a diagonal programming order of pages of each plane of the three dimensional array, and (b) for a second programming level, a column based programming; and
  (ii) the multiple phase programming scheme determines a diagonal programming order of pages of each plane of the three dimensional array.

23. The non-transitory computer readable medium according to claim 19 wherein the multiple phase programming scheme defines (a) the edge programming rule that is associated with edge flash memory cells and (b) the non-edge programming rule that differs from the edge programming rule and is associated with non-edge flash memory cells.

24. The non-transitory computer readable medium according to claim 19 wherein the three dimensional array comprises multiple planes of flash memory cells, each plane comprises multiple rows and columns of flash memory cells; and wherein the multiple phase programming scheme determines the order of programming pages, wherein the order of programming pages is responsive to coupling between flash memory cells that belong to different planes.

25. The non-transitory computer readable medium according to claim 19 wherein the three dimensional array comprises multiple planes of flash memory cells that comprise multiple pages, wherein the multiple pages are programmed one group of pages after the other; wherein each group of pages comprises pages located along the same virtual line; wherein each virtual line is orthogonal to the plane.

26. The non-transitory computer readable medium according to claim 19 wherein the three dimensional array comprises multiple planes of flash memory cells that comprise multiple pages, wherein the multiple pages are programmed one group of pages after the other; wherein each group of pages comprises pages located along the same virtual line; wherein each virtual line is neither parallel or orthogonal to the plane.

27. The non-transitory computer readable medium according to claim 19 wherein the multiple phase programming scheme determines, (a) for the first programming level, the diagonal programming order of pages of each plane of the three dimensional array, and (b) for the second programming level, the column based programming.

28. The memory controller according to claim 20 wherein the multiple phase programming scheme defines (a) the edge programming rule that is associated with edge flash memory cells and (b) the non-edge programming rule that differs from the edge programming rule and is associated with non-edge flash memory cells.

29. The memory controller according to claim 20 wherein the three dimensional array comprises multiple planes of flash memory cells, each plane comprises multiple rows and columns of flash memory cells; and wherein the multiple phase programming scheme determines the order of programming pages, wherein the order of programming pages is responsive to coupling between flash memory cells that belong to different planes.

30. The memory controller according to claim 20 wherein the three dimensional array comprises multiple planes of flash memory cells that comprise multiple pages, wherein the multiple pages are programmed one group of pages after the other; wherein each group of pages comprises pages located along the same virtual line; wherein each virtual line is orthogonal to the plane.

31. The memory controller according to claim 20 wherein the three dimensional array comprises multiple planes of flash memory cells that comprise multiple pages, wherein the multiple pages are programmed one group of pages after the other; wherein each group of pages comprises pages located along the same virtual line; wherein each virtual line is neither parallel or orthogonal to the plane.

32. The memory controller according to claim 20 wherein the multiple phase programming scheme determines, (a) for the first programming level, the diagonal programming order of pages of each plane of the three dimensional array, and (b) for a second programming level, the column based programming.

* * * * *